(12) United States Patent
Morris et al.

(10) Patent No.: US 10,777,524 B2
(45) Date of Patent: Sep. 15, 2020

(54) USING AN INTERCONNECT BUMP TO TRAVERSE THROUGH A PASSIVATION LAYER OF A SEMICONDUCTOR DIE

(71) Applicant: Qorvo US, Inc., Greensboro, NC (US)

(72) Inventors: Thomas Scott Morris, Lewisville, NC (US); Michael Meeder, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/113,243

(22) Filed: Aug. 27, 2018

(65) Prior Publication Data
US 2018/0366431 A1   Dec. 20, 2018

Related U.S. Application Data

(62) Division of application No. 15/278,960, filed on Sep. 28, 2016, now abandoned, which is a division of
(Continued)

(51) Int. Cl.
*H01L 23/00* (2006.01)
*H01L 23/498* (2006.01)
(Continued)

(52) U.S. Cl.
CPC ........ *H01L 24/14* (2013.01); *H01L 21/76885* (2013.01); *H01L 23/3192* (2013.01);
(Continued)

(58) Field of Classification Search
CPC ... H01L 23/00; H01L 24/14; H01L 23/49811; H01L 21/76885; H01L 23/367; H01L 23/3192; H01L 23/4824; H01L 24/05; H01L 2224/16225; H01L 2224/05569; H01L 2224/05008; H01L 2224/05022; H01L 2224/05548; H01L 2224/05567;
(Continued)

(56) References Cited

U.S. PATENT DOCUMENTS 6,403,401 B1   6/2002   Aquien et al.
6,578,754 B1   6/2003   Tung
(Continued)

OTHER PUBLICATIONS

Gupta, Debabrata, "A Novel Active Area Bumped Flip Chip Technology for Convergent Heat Transfer from Gallium Arsenide Power Devices," IEEE Transactions on Components, Packaging and Manufacturing Technology, Part A., vol. 18, No. 1, Mar. 1995, pp. 82-86.
(Continued)

*Primary Examiner* — Alexander O Williams
(74) *Attorney, Agent, or Firm* — Withrow & Terranova, P.L.L.C.

(57) ABSTRACT

A semiconductor die, which includes a first semiconductor device, a first passivation layer, and a first interconnect bump, is disclosed. The first passivation layer is over the first semiconductor device, which includes a first group of device fingers. The first interconnect bump is thermally and electrically connected to each of the first group of device fingers. Additionally, the first interconnect bump protrudes through a first opening in the first passivation layer.

19 Claims, 12 Drawing Sheets

Related U.S. Application Data application No. 13/948,516, filed on Jul. 23, 2013, now abandoned.

(60) Provisional application No. 61/674,577, filed on Jul. 23, 2012.

(51) Int. Cl.

| | | |
|---|---|---|
| *H01L 21/768* | (2006.01) | |
| *H01L 23/367* | (2006.01) | |
| *H01L 23/31* | (2006.01) | |
| *H01L 23/482* | (2006.01) | |

(52) U.S. Cl.
CPC ........ *H01L 23/367* (2013.01); *H01L 23/4824* (2013.01); *H01L 23/49811* (2013.01); *H01L 24/05* (2013.01); *H01L 24/13* (2013.01); H01L 2224/02206 (2013.01); H01L 2224/02215 (2013.01); H01L 2224/0401 (2013.01); H01L 2224/05008 (2013.01); H01L 2224/05022 (2013.01); H01L 2224/05166 (2013.01); H01L 2224/05548 (2013.01); H01L 2224/05552 (2013.01); H01L 2224/05567 (2013.01); H01L 2224/05569 (2013.01); H01L 2224/05572 (2013.01); H01L 2224/05573 (2013.01); H01L 2224/05582 (2013.01); H01L 2224/05647 (2013.01); H01L 2224/05666 (2013.01); H01L 2224/13013 (2013.01); H01L 2224/13022 (2013.01); H01L 2224/13024 (2013.01); H01L 2224/13026 (2013.01); H01L 2224/13082 (2013.01); H01L 2224/13111 (2013.01); H01L 2224/13144 (2013.01); H01L 2224/14519 (2013.01); H01L 2224/16225 (2013.01); H01L 2224/16227 (2013.01); H01L 2924/00014 (2013.01); H01L 2924/05442 (2013.01); H01L 2924/10329 (2013.01); H01L 2924/1305 (2013.01); H01L 2924/13051 (2013.01)

(58) Field of Classification Search
CPC . H01L 2224/05573; H01L 2224/05582; H01L 2224/05647; H01L 2224/05666; H01L 2224/13013; H01L 2224/13022; H01L 2224/13024; H01L 2224/13082; H01L 2224/13111; H01L 2224/16227; H01L 2224/05572; H01L 2924/1305; H01L 2924/00014; H01L 2924/02206; H01L 2924/02215; H01L 2224/05166; H01L 2224/13026; H01L 2224/13144; H01L 2224/14519; H01L 2924/05442; H01L 2924/10329; H01L 2924/13051; H01L 2224/05552; H01L 2924/01047; H01L 2924/00; H01L 23/498; H01L 21/768; H01L 23/31; H01L 23/482
USPC .......................................... 257/737, 738, 778
See application file for complete search history.

(56) References Cited

U.S. PATENT DOCUMENTS

| | | | |
|---|---|---|---|
| 6,592,019 B2 | 7/2003 | Tung | |
| 6,681,982 B2 | 1/2004 | Tung | |
| 6,884,661 B1 | 4/2005 | Morris et al. | |
| 7,705,425 B2* | 4/2010 | Ma | H01L 29/0692 |
| | | | 257/587 |
| 8,426,278 B2 | 4/2013 | Sultan et al. | |
| 8,507,317 B2 | 8/2013 | Bachman et al. | |
| 8,604,330 B1* | 12/2013 | Hennessy | H01L 31/05 |
| | | | 136/201 |
| 9,269,710 B2 | 2/2016 | Sultan et al. | |
| 9,600,109 B2* | 3/2017 | Oh | G02F 1/13338 |
| 2002/0145566 A1 | 10/2002 | Ballantine et al. | |
| 2002/0155661 A1 | 10/2002 | Massingill et al. | |
| 2004/0110366 A1 | 6/2004 | MacKay et al. | |
| 2006/0131691 A1 | 6/2006 | Roozeboom et al. | |
| 2008/0093736 A1 | 4/2008 | Tokuda | |
| 2008/0315398 A1 | 12/2008 | Lo et al. | |
| 2009/0108464 A1 | 4/2009 | Uchiyama | |
| 2009/0146760 A1 | 6/2009 | Reefman et al. | |
| 2010/0105200 A1 | 4/2010 | Lin et al. | |
| 2011/0101519 A1 | 5/2011 | Hsiao et al. | |
| 2011/0303980 A1 | 12/2011 | Sultan et al. | |
| 2012/0038046 A1 | 2/2012 | Lin et al. | |
| 2012/0162928 A1 | 6/2012 | Das et al. | |
| 2012/0187421 A1 | 7/2012 | Cheng et al. | |
| 2013/0026629 A1 | 1/2013 | Nakano | |
| 2013/0087808 A1* | 4/2013 | Konstantinov | H01L 29/045 |
| | | | 257/77 |
| 2013/0147026 A1 | 6/2013 | Topacio et al. | |
| 2013/0264684 A1 | 10/2013 | Yu et al. | |
| 2014/0021603 A1* | 1/2014 | Morris | H01L 23/49811 |
| | | | 257/737 |
| 2014/0054596 A1 | 2/2014 | Ritenour | |
| 2014/0054602 A1 | 2/2014 | Johnson | |
| 2014/0131860 A1 | 5/2014 | Kanda et al. | |
| 2014/0138788 A1 | 5/2014 | Kim et al. | |
| 2014/0326295 A1* | 11/2014 | Moslehi | H02S 20/25 |
| | | | 136/249 |
| 2014/0360567 A1* | 12/2014 | Seutter | H01B 1/023 |
| | | | 136/256 |
| 2015/0236182 A1* | 8/2015 | Moslehi | H01L 31/0475 |
| | | | 136/249 |
| 2016/0087579 A1* | 3/2016 | Moslehi | H01L 31/0516 |
| | | | 136/251 |
| 2017/0221887 A1 | 8/2017 | Malladi et al. | |

OTHER PUBLICATIONS

Non-Final Office Action for U.S. Appl. No. 13/948,516, dated Sep. 15, 2014, 8 pages.
Final Office Action for U.S. Appl. No. 13/948,516, dated Apr. 1, 2015, 10 pages.
Non-Final Office Action for U.S. Appl. No. 13/948,516, dated Jul. 21, 2015, 8 pages.
Final Office Action for U.S. Appl. No. 13/948,516, dated Jun. 28, 2016, 11 pages.
Final Office Action for U.S. Appl. No. 15/278,960, dated Apr. 6, 2018, 6 pages.
Non-Final Office Action for U.S. Appl. No. 15/278,960, dated Sep. 22, 2017, 6 pages.
Non-Final Office Action for U.S. Appl. No. 15/278,960, dated Apr. 6, 2017, 8 pages.

\* cited by examiner

USING AN INTERCONNECT BUMP TO TRAVERSE THROUGH A PASSIVATION LAYER OF A SEMICONDUCTOR DIE

RELATED APPLICATIONS

This application is a divisional application of U.S. patent application Ser. No. 15/278,960, filed Sep. 28, 2016, which is a divisional application of U.S. patent application Ser. No. 13/948,516, filed Jul. 23, 2013, which claims the benefit of U.S. provisional patent application No. 61/674,577, filed Jul. 23, 2012.

All of the disclosures listed above are hereby incorporated herein by reference in their entireties.

FIELD OF THE DISCLOSURE

Embodiments of the present disclosure relate to semiconductor dies and methods for electrically and thermally connecting the semiconductor dies to external circuitry.

BACKGROUND

As size, functionality, density, and power of semiconductor dies increase, the number of electrical connections to and from a semiconductor die tends to increase, and the amount of heat needed to be discarded from a semiconductor die also tends to increase. Further, cost and size of a semiconductor die need to be minimized in today's competitive environment. Thus, there is a need for a semiconductor die that provides high functionality, high density, low cost, small size, and discards heat effectively.

SUMMARY

A semiconductor die, which includes a first semiconductor device, a first passivation layer, and a first interconnect bump, is disclosed. The first passivation layer is over the first semiconductor device, which includes a first group of device fingers. The first interconnect bump is thermally and electrically connected to each of the first group of device fingers. Additionally, the first interconnect bump protrudes through a first opening in the first passivation layer.

In one embodiment of the semiconductor die, the first interconnect bump is configured to conduct heat away from the first semiconductor device. Further, in one embodiment of the semiconductor die, the first interconnect bump is further configured to provide an external electrical connection to the first semiconductor device. The first interconnect bump may have high thermal conductivity and low electrical resistivity. Therefore, by thermally and electrically connecting to each of the first group of device fingers through the first opening in the first passivation layer, the first interconnect bump may provide improved thermal and electrical connectivity over existing designs.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "coupled" to another element, it can be directly coupled to the other element or intervening elements may be present. In contrast, when an element is referred to as being "directly coupled" to another element, there are no intervening elements present. It will also be understood that when an element is referred to as being "connected" to another element, it can be directly connected to the other element or intervening conductive elements may be present. In contrast, when an element is referred to as being "directly connected" to another element, there are no intervening conductive elements present.

The term "thermally connected" is defined herein and for any claims that follow to require a coupling wherein the thermal conductivity of the coupling is greater than or equal to about 10 British thermal units per hour-degree Fahrenheit-foot. The term "electrically connected" is defined herein and for any claims that follow to require a coupling wherein the electrical resistivity is less than or equal to about $25 \times 10^{-8}$ ohm-meters. Any intervening conductive elements would have an electrical resistivity of less than or equal to about $25 \times 10^{-8}$ ohm-meters. Any intervening conductive elements would have a thermal conductivity of greater than or equal to about 10 British thermal units per hour-degree Fahrenheit-foot.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
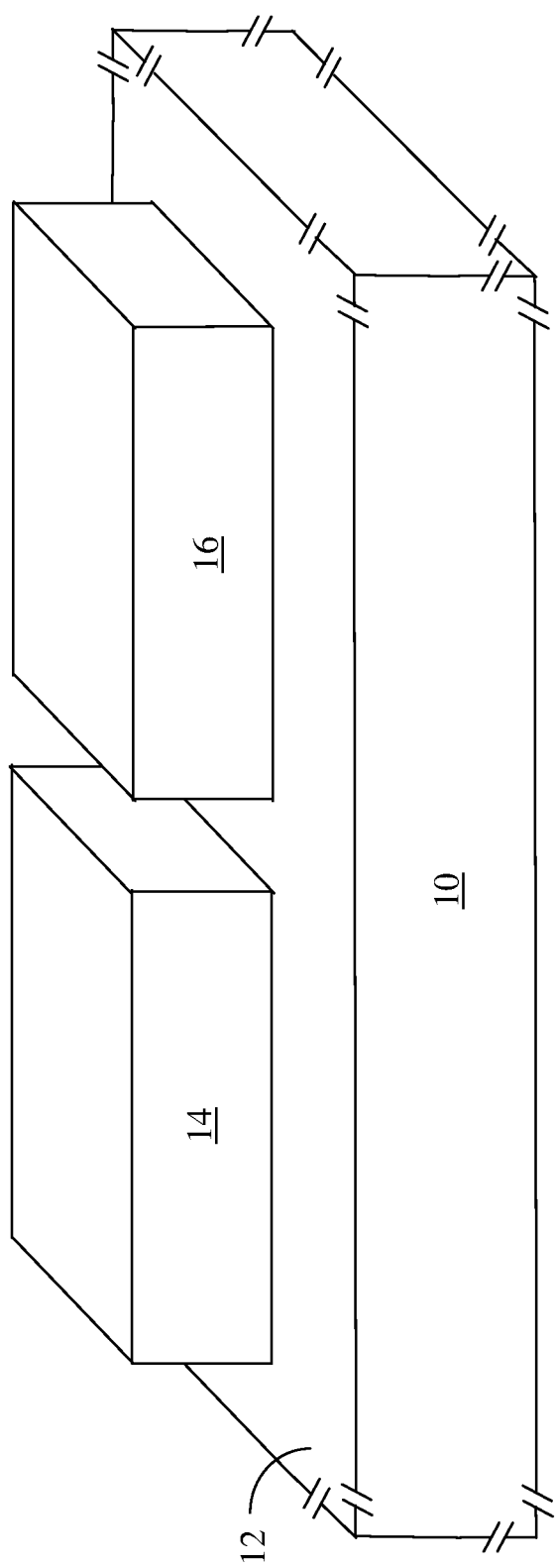
FIG. 1 shows a semiconductor die according to one embodiment of the semiconductor die.

FIG. 1 shows a 3D view of a semiconductor die 10 according to one embodiment of the semiconductor die 10. The semiconductor die 10 includes a first passivation layer 12, a first interconnect bump 14, and a second interconnect bump 16. In one embodiment of the first passivation layer 12, the first passivation layer 12 is the uppermost layer of the semiconductor die 10.

The first interconnect bump 14 protrudes through the first passivation layer 12 and the second interconnect bump 16 protrudes through the first passivation layer 12. Alternate embodiments of the semiconductor die 10 may include any number of interconnect bumps protruding through the first passivation layer 12.

In one embodiment of the first interconnect bump 14, the first interconnect bump 14 is a flip chip bump. In one embodiment of the second interconnect bump 16, the second interconnect bump 16 is a flip chip bump. In one embodiment of the first interconnect bump 14, the first interconnect bump 14 includes Copper. In an alternate embodiment of the first interconnect bump 14, the first interconnect bump 14 consists of Copper. In another embodiment of the first interconnect bump 14, the first interconnect bump 14 includes any metal. In one embodiment of the second interconnect bump 16, the second interconnect bump 16 includes Copper. In an alternate embodiment of the second interconnect bump 16, the second interconnect bump 16 consists of Copper. In another embodiment of the second interconnect bump 16, the second interconnect bump 16 includes any metal.

In one embodiment of the first interconnect bump 14, a thermal conductivity of the first interconnect bump 14 is greater than or equal to about 10 British thermal units per hour-degree Fahrenheit-foot. In one embodiment of the first interconnect bump 14, an electrical resistivity of the first interconnect bump 14 is less than or equal to about $25 \times 10^{-8}$ ohm-meters. In one embodiment of the second interconnect bump 16, a thermal conductivity of the second interconnect bump 16 is greater than or equal to about 10 British thermal units per hour-degree Fahrenheit-foot. In one embodiment of the second interconnect bump 16, an electrical resistivity of the second interconnect bump 16 is less than or equal to about $25 \times 10^{-8}$ ohm-meters.

In one embodiment of the first interconnect bump 14, a height of the first interconnect bump 14 is between about 40 micrometers and about 100 micrometers. In one embodiment of the second interconnect bump 16, a height of the second interconnect bump 16 is between about 40 micrometers and about 100 micrometers. In one embodiment of the first interconnect bump 14, a width of the first interconnect bump 14 is between about 70 micrometers and about 90 micrometers and a length of the first interconnect bump 14 is between about 80 micrometers and about 500 micrometers. In one embodiment of the second interconnect bump 16, a width of the second interconnect bump 16 is between about 70 micrometers and about 90 micrometers and a length of the second interconnect bump 16 is between about 80 micrometers and about 500 micrometers.

In one embodiment of the first interconnect bump 14, the vertical corners of the first interconnect bump 14 are rounded. In one embodiment of the first interconnect bump 14, the horizontal corners of the first interconnect bump 14 are rounded. In one embodiment of the second interconnect bump 16, the vertical corners of the second interconnect bump 16 are rounded. In one embodiment of the second interconnect bump 16, the horizontal corners of the second interconnect bump 16 are rounded. In an alternate embodiment of the first interconnect bump 14, the first interconnect bump 14 is of any shape. In an alternate embodiment of the second interconnect bump 16, the second interconnect bump 16 is of any shape.

Figure 2:
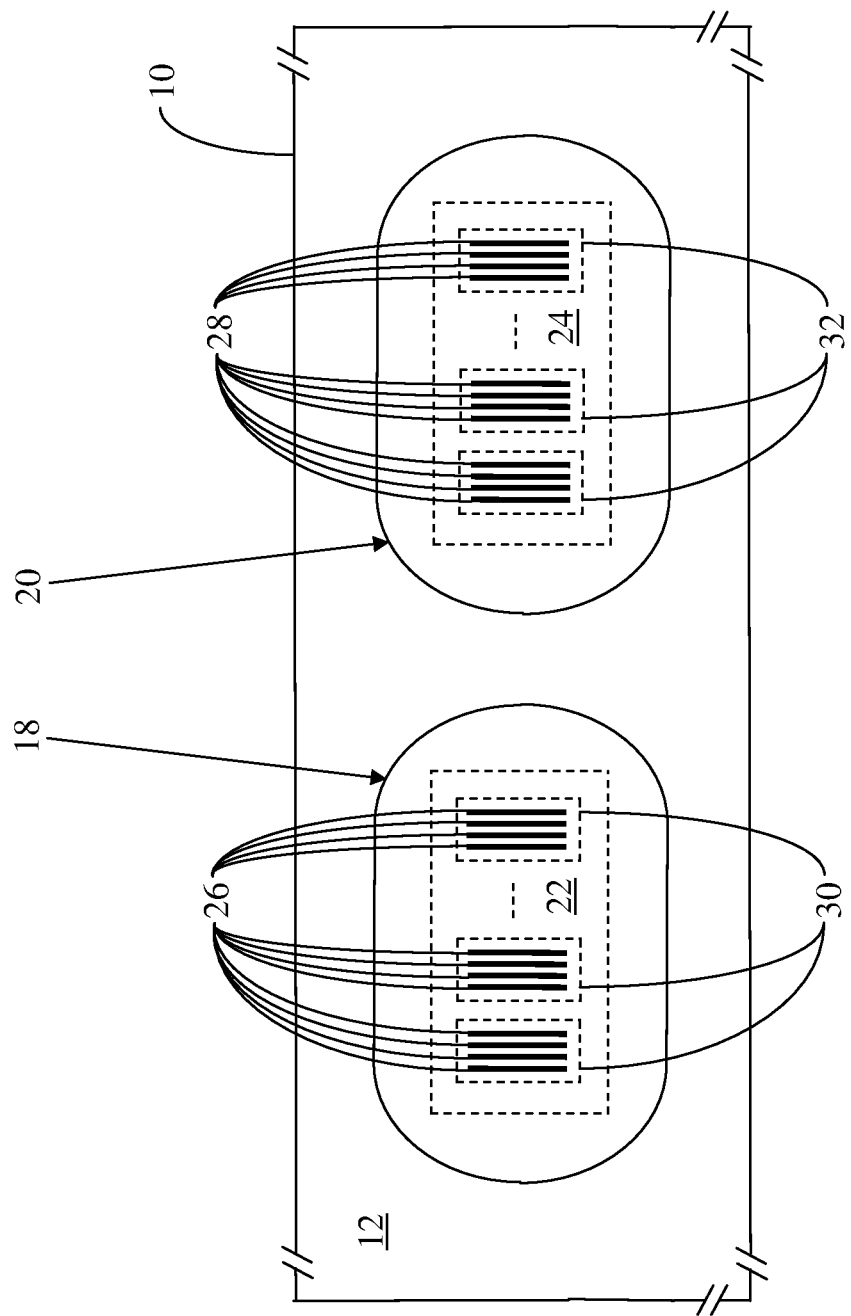
FIG. 2 shows the semiconductor die according to an alternate embodiment of the semiconductor die.

FIG. 2 shows a top view of the semiconductor die 10 according to an alternate embodiment of the semiconductor die 10. The semiconductor die 10 illustrated in FIG. 2 is similar to the semiconductor die 10 illustrated in FIG. 1, except in the semiconductor die 10 illustrated in FIG. 2, the first interconnect bump 14 and the second interconnect bump 16 are not shown for clarity.

The first passivation layer 12 has a first opening 18 and a second opening 20. The first interconnect bump 14 (FIG. 1) protrudes through the first opening 18 in the first passivation layer 12 and the second interconnect bump 16 (FIG. 1) protrudes through the second opening 20 in the first passivation layer 12. The semiconductor die 10 further includes a first semiconductor device 22 and a second semiconductor device 24. The first semiconductor device 22 and the second semiconductor device 24 can be seen through the first opening 18 and the second opening 20, respectively. As such, the first passivation layer 12 is over the first semiconductor device 22 and the first passivation layer 12 is over the second semiconductor device 24. In one embodiment of the first semiconductor device 22 and the second semiconductor device 24, the first opening 18 is directly over the first semiconductor device 22 and the second opening 20 is directly over the second semiconductor device 24.

The first semiconductor device 22 has a first group 26 of device fingers and the second semiconductor device 24 has a second group 28 of device fingers. The first interconnect bump 14 (FIG. 1) is thermally and electrically connected to each of the first group 26 of device fingers. The second interconnect bump 16 (FIG. 1) is thermally and electrically connected to each of the second group 28 of device fingers.

In one embodiment of the semiconductor die 10, the first interconnect bump 14 (FIG. 1) is configured to conduct heat away from the first semiconductor device 22. Further, in one embodiment of the semiconductor die 10, the first interconnect bump 14 (FIG. 1) is further configured to provide an external electrical connection to the first semiconductor device 22. Due to its relative size and form factor, the first interconnect bump 14 (FIG. 1) may have high thermal conductivity and low electrical resistivity. Therefore, by thermally and electrically connecting to each of the first group 26 of device fingers through the first opening 18 in the first passivation layer 12, the first interconnect bump 14 (FIG. 1) may provide improved thermal and electrical connectivity over existing designs.

In one embodiment of the semiconductor die 10, the second interconnect bump 16 (FIG. 1) is configured to conduct heat away from the second semiconductor device 24. Further, in one embodiment of the semiconductor die 10, the second interconnect bump 16 (FIG. 1) is further configured to provide an external electrical connection to the second semiconductor device 24. Due to its relative size and form factor, the second interconnect bump 16 (FIG. 1) may have high thermal conductivity and low electrical resistivity. Therefore, by thermally and electrically connecting to each of the second group 28 of device fingers through the second opening 20 in the first passivation layer 12, the second interconnect bump 16 (FIG. 1) may provide improved thermal and electrical connectivity over existing designs.

In one embodiment of the first passivation layer 12, the first passivation layer 12 includes BenzoCycloButene. In an alternate embodiment of the first passivation layer 12, the first passivation layer 12 includes Polyimide. In another embodiment of the first passivation layer 12, the first passivation layer 12 includes any passivation material.

The first semiconductor device 22 has a first group 30 of sub-cells, such that each of the first group 30 of sub-cells has a corresponding portion of the first group 26 of device fingers. For example, in the first semiconductor device 22 illustrated in FIG. 2, the first group 26 of device fingers has 12 device fingers and each of the first group 30 of sub-cells has 4 device fingers.

Similarly, the second semiconductor device 24 has a second group 32 of sub-cells, such that each of the second group 32 of sub-cells has a corresponding portion of the second group 28 of device fingers. For example, in the second semiconductor device 24 illustrated in FIG. 2, the second group 28 of device fingers has 12 device fingers and each of the second group 32 of sub-cells has 4 device fingers.

Alternate embodiments of the semiconductor die 10 may include any number of semiconductor devices. Each semiconductor device may include any number of device fingers. Further, each semiconductor device may include any number of sub-cells. Each sub-cell may include any number of device fingers. Further, the semiconductor die 10 may include any number of interconnect bumps and the first passivation layer 12 may include any number of openings as long as each interconnect bump protrudes through an opening in the first passivation layer 12.

Figure 3:
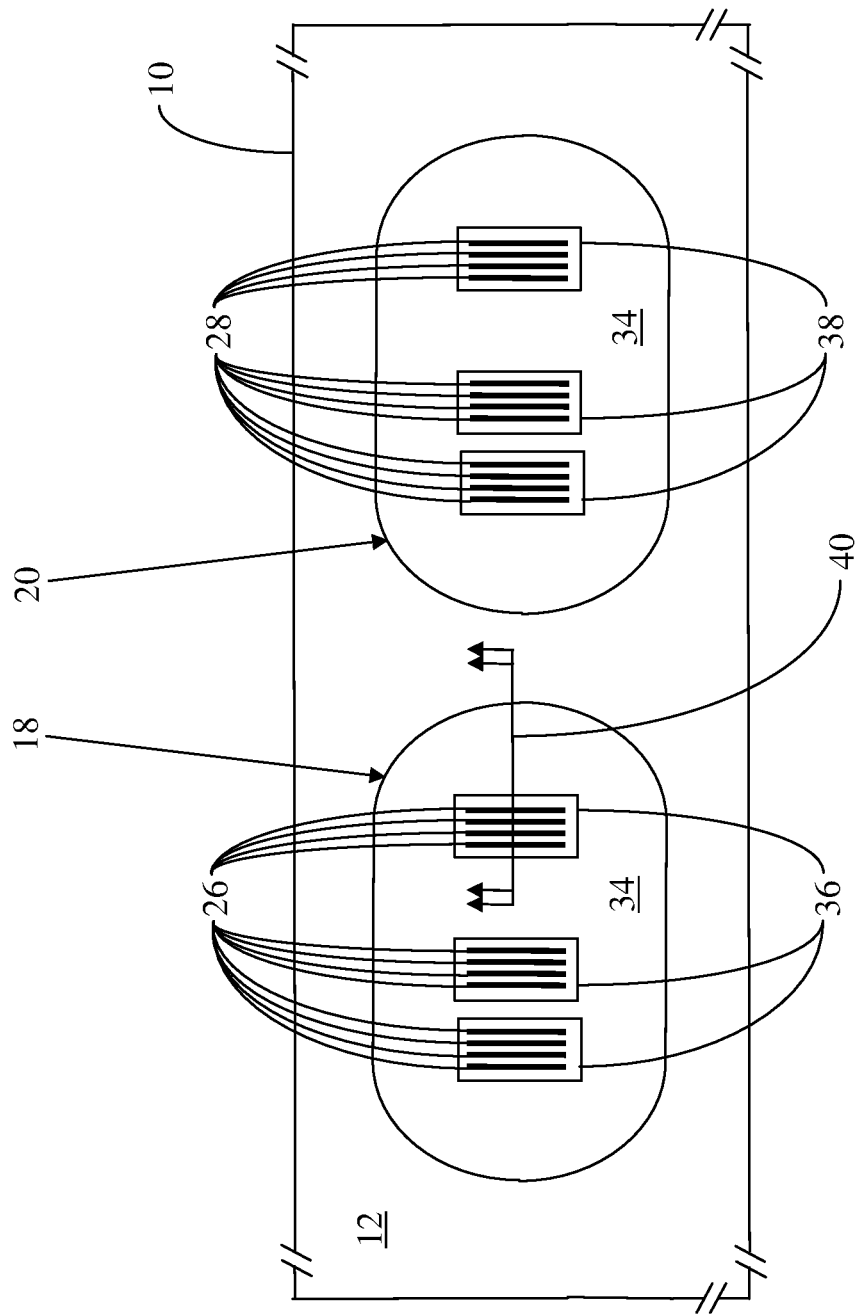
FIG. 3 shows the semiconductor die according to an additional embodiment of the semiconductor die.

FIG. 3 shows the semiconductor die 10 according to an additional embodiment of the semiconductor die 10. The semiconductor die 10 illustrated in FIG. 3 is similar to the semiconductor die 10 illustrated in FIG. 2, except in the semiconductor die 10 illustrated in FIG. 3, the semiconductor die 10 further includes a second passivation layer 34. The first passivation layer 12 is over the second passivation layer 34. As such, the second passivation layer 34 is visible through the first opening 18 and through the second opening 20. The second passivation layer 34 is over the first semiconductor device 22 (FIG. 2) and over the second semiconductor device 24 (FIG. 2). Further, the second passivation layer 34 has a first group 36 of openings and a second group 38 of openings.

In one embodiment of the second passivation layer 34, the second passivation layer 34 includes Silicon Dioxide. In one embodiment of the second passivation layer 34, the second passivation layer 34 includes Silicon Nitride. In another embodiment of the second passivation layer 34, the second passivation layer 34 includes any passivation material. In one embodiment of the second passivation layer 34, a thickness of the second passivation layer 34 adjacent to each of the first group 36 of openings is between about 150 nanometers and about 5500 nanometers. In one embodiment of the second passivation layer 34, a thickness of the second passivation layer 34 adjacent to each of the second group 38 of openings is between about 150 nanometers and about 5500 nanometers.

In one embodiment of the second passivation layer 34, each of the first group 36 of openings is directly over a corresponding one of the first group 30 (FIG. 2) of sub-cells. As such, in one embodiment of the first interconnect bump 14 (FIG. 1), the first interconnect bump 14 (FIG. 1) further protrudes through each of the first group 36 of openings. In one embodiment of the second passivation layer 34, each of the second group 38 of openings is directly over a corresponding one of the second group 32 (FIG. 2) of sub-cells. As such, in one embodiment of the second interconnect bump 16 (FIG. 1), the second interconnect bump 16 (FIG. 1) further protrudes through each of the second group 38 of openings. A location of a cross-section 40 of a portion of the semiconductor die 10 is illustrated in FIG. 3.

Figure 4:
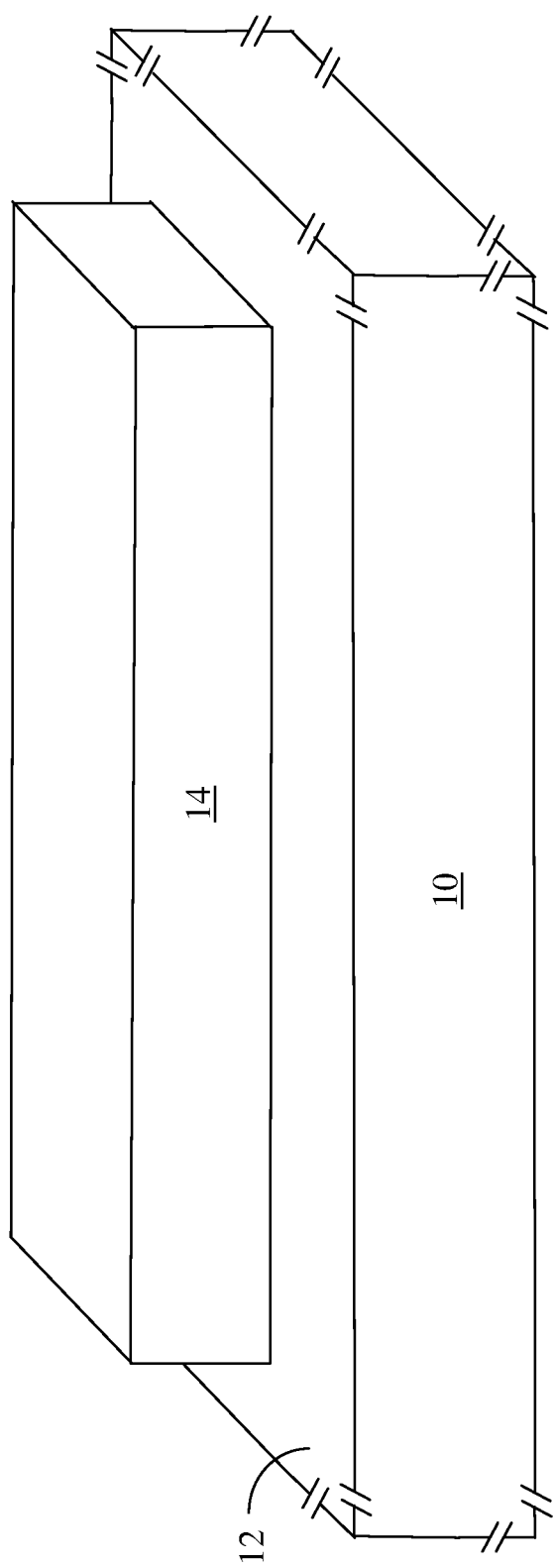
FIG. 4 shows the semiconductor die according to another embodiment of the semiconductor die.

FIG. 4 shows the semiconductor die 10 according to another embodiment of the semiconductor die 10. The semiconductor die 10 illustrated in FIG. 4 is similar to the semiconductor die 10 illustrated in FIG. 1, except in the semiconductor die 10 illustrated in FIG. 4, the second interconnect bump 16 (FIG. 1) is omitted.

Figure 5:
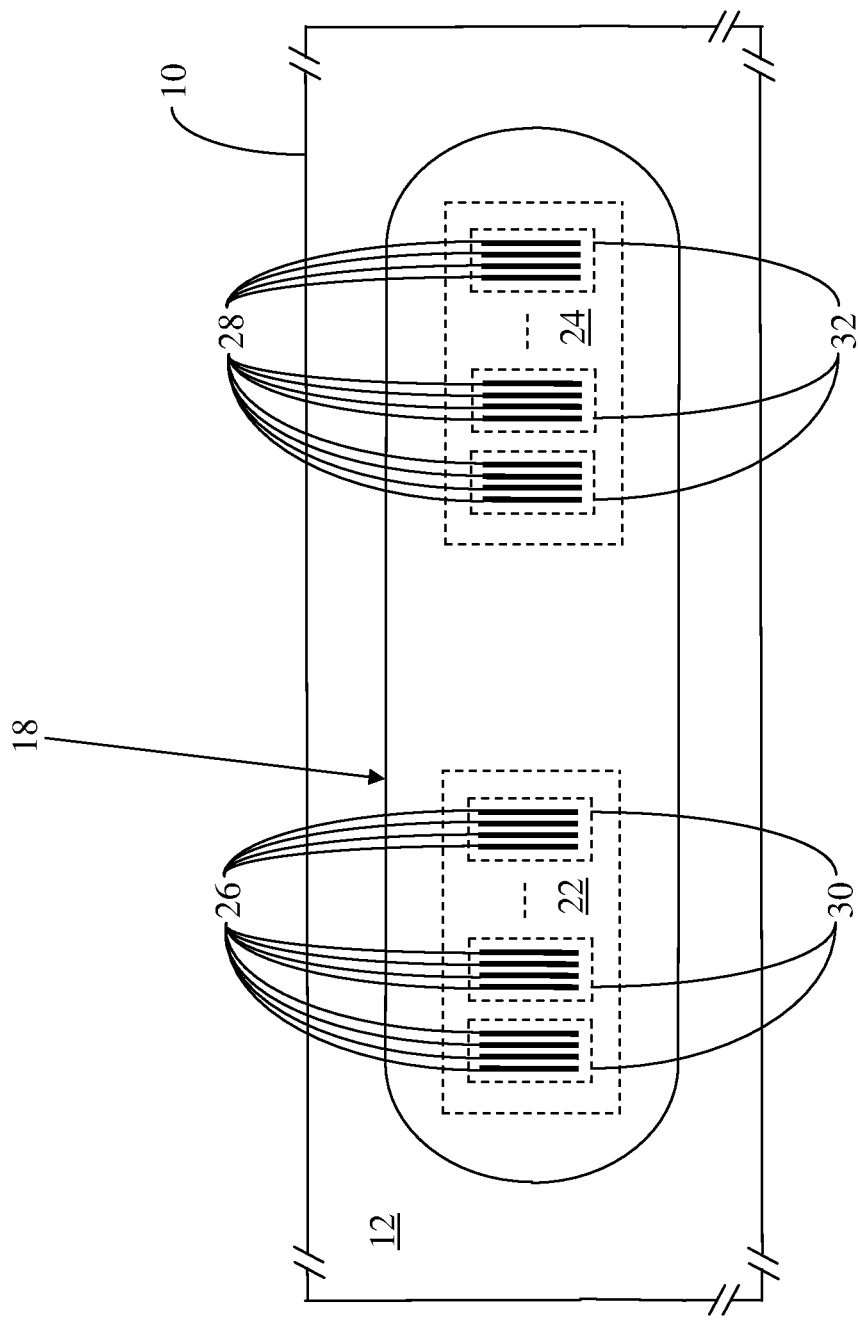
FIG. 5 shows the semiconductor die according to a further embodiment of the semiconductor die.

FIG. 5 shows the semiconductor die 10 according to a further embodiment of the semiconductor die 10. The semiconductor die 10 illustrated in FIG. 5 is similar to the semiconductor die 10 illustrated in FIG. 2, except in the semiconductor die 10 illustrated in FIG. 5, the second opening 20 is omitted and the first opening 18 is elongated, such that the first opening 18 is over both the first semiconductor device 22 and the second semiconductor device 24. In this regard, the first interconnect bump 14 (FIG. 4) is thermally and electrically connected to both the first group 26 of device fingers and the second group 28 of device fingers.

Figure 6:
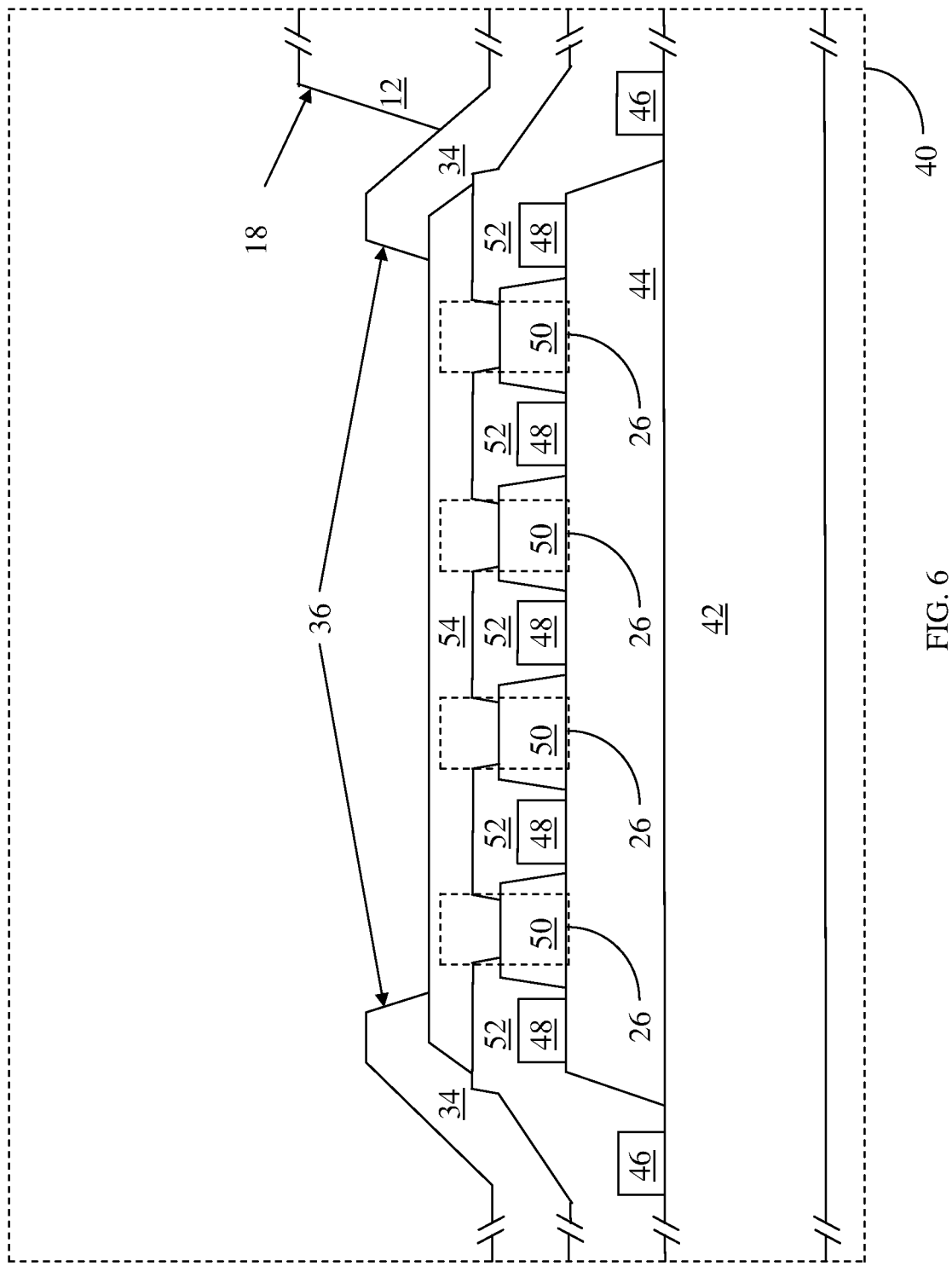
FIG. 6 shows a cross-section of a portion of the semiconductor die illustrated in FIG. 3 according to one embodiment of the cross-section.

FIG. 6 shows the cross-section 40 of the portion of the semiconductor die 10 illustrated in FIG. 3 according to one embodiment of the cross-section 40. The cross-section 40 includes one of the first group 30 of sub-cells (FIG. 2) of the first semiconductor device 22 (FIG. 2); therefore, the cross-section 40 includes a portion of the first group 26 of device fingers. The cross-section 40 further includes a portion of the first passivation layer 12, a portion of the second passivation layer 34, a first semiconductor material 42, a base mesa 44, first semiconductor material contacts 46, base contacts 48, a second semiconductor material 50, a dielectric material 52, and a first interconnect layer 54. As such, four of the first group 26 of device fingers are illustrated.

The first semiconductor material contacts 46 are on the first semiconductor material 42. The base mesa 44 is on the first semiconductor material 42. The base contacts 48 are on the base mesa 44. Each of the portion of the first group 26 of device fingers is on the base mesa 44. Further, each of the first group 26 of device fingers includes a corresponding portion of the second semiconductor material 50 and a corresponding portion of the first interconnect layer 54, such that each corresponding portion of the first interconnect layer 54 is on the corresponding portion of the second semiconductor material 50. The dielectric material 52 insulates the base contacts 48 from the portion of the first group 26 of device fingers.

In the embodiment of the cross-section 40 illustrated in FIG. 6, the first interconnect layer 54 provides a connection between the portion of the first group 26 of device fingers of the one of the first group 30 of sub-cells (FIG. 2). In an alternate embodiment of the cross-section 40 (not shown), the first interconnect layer 54 does not provide the connection between the portion of the first group 26 of device fingers of the one of the first group 30 of sub-cells (FIG. 2).

The second passivation layer 34 is on a portion of the first interconnect layer 54 and is on a portion of the dielectric material 52. The first passivation layer 12 is on a portion of the second passivation layer 34. Therefore, only a portion of the first interconnect layer 54, a portion of the second passivation layer 34, and the first passivation layer 12 are exposed. A portion of the first opening 18 and one of the first group 36 of openings are identified for clarity.

In one embodiment of the first interconnect layer 54, the first interconnect layer 54 includes gold. In one embodiment of the first interconnect layer 54, the first interconnect layer 54 includes any metal. In one embodiment of the first semiconductor material 42, the first semiconductor material 42 includes Gallium Arsenide. In one embodiment of the first semiconductor material 42, the first semiconductor material 42 includes Gallium Nitride. In one embodiment of the first semiconductor material 42, the first semiconductor material 42 includes Silicon. In one embodiment of the first semiconductor material 42, the first semiconductor material 42 includes N-type Gallium Arsenide. In one embodiment of the first semiconductor material 42, the first semiconductor material 42 includes P-type Gallium Arsenide.

In one embodiment of the second semiconductor material 50, the second semiconductor material 50 includes Gallium Arsenide. In one embodiment of the second semiconductor material 50, the second semiconductor material 50 includes Gallium Nitride. In one embodiment of the second semiconductor material 50, the second semiconductor material 50 includes Silicon. In one embodiment of the second semiconductor material 50, the second semiconductor material 50 includes N-type Gallium Arsenide. In one embodiment of the second semiconductor material 50, the second semiconductor material 50 includes P-type Gallium Arsenide. In one embodiment of the base mesa 44, the base mesa 44 includes Gallium Arsenide. In one embodiment of the base mesa 44, the base mesa 44 includes Gallium Nitride. In one embodiment of the base mesa 44, the base mesa 44 includes Silicon. In one embodiment of the base mesa 44, the base mesa 44 includes P-type Gallium Arsenide. In one embodiment of the base mesa 44, the base mesa 44 includes N-type Gallium Arsenide.

In one embodiment of the first semiconductor device 22 (FIG. 2), the first semiconductor device 22 (FIG. 2) is a transistor. In one embodiment of the transistor, an emitter of the transistor includes the first group 26 of device fingers. In one embodiment of the transistor, a collector of the transistor includes the first group 26 of device fingers. In one embodiment of the first semiconductor device 22 (FIG. 2), the first semiconductor device 22 (FIG. 2) is a heterojunction bipolar transistor. In one embodiment of the first semiconductor device 22 (FIG. 2), the first semiconductor device 22 (FIG. 2) is a bipolar junction transistor.

Figure 7:
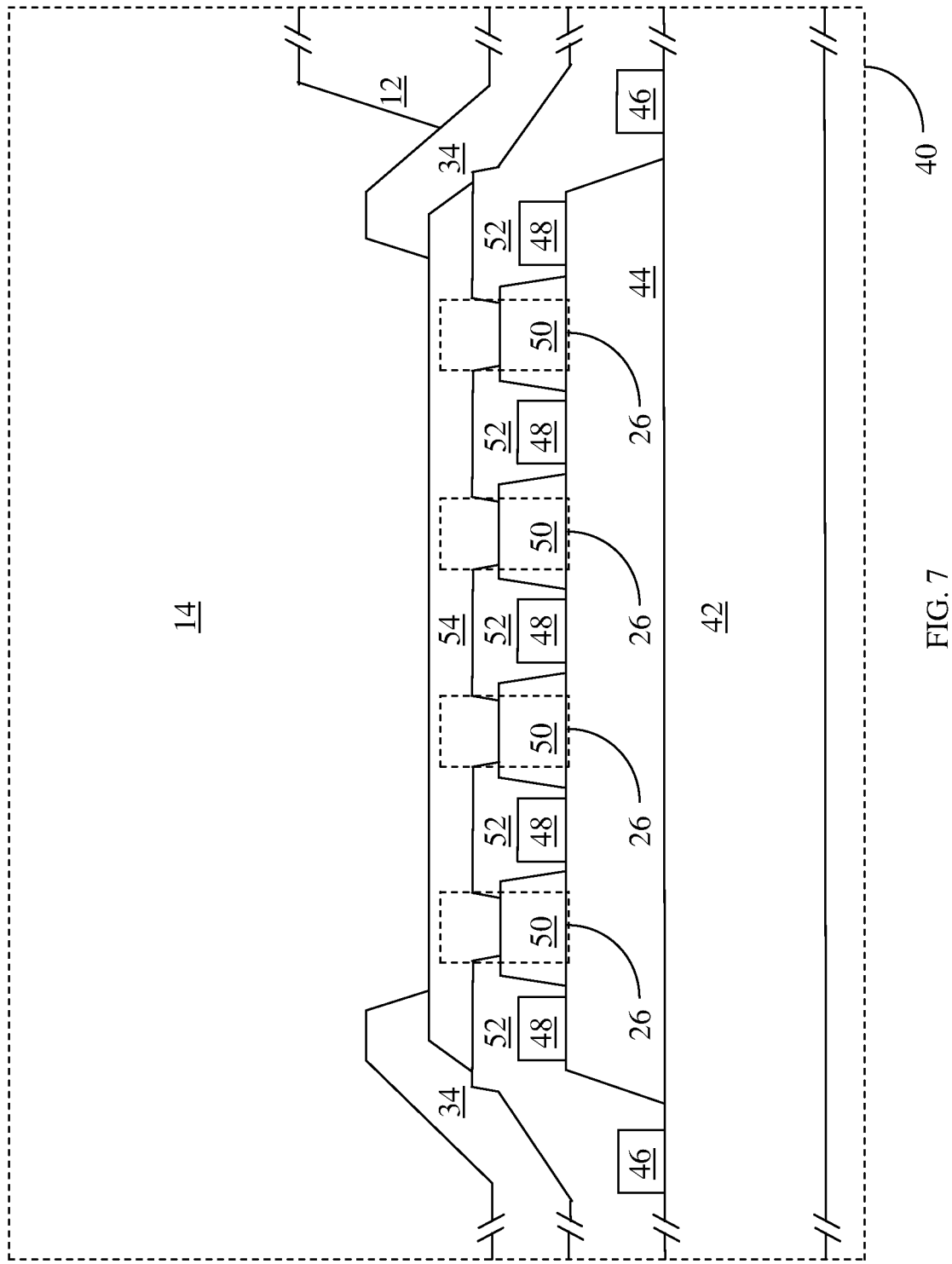
FIG. 7 shows the cross-section of the portion of the semiconductor die illustrated in FIG. 3 according to an alternate embodiment of the cross-section.

FIG. 7 shows the cross-section 40 of the portion of the semiconductor die 10 illustrated in FIG. 3 according to an alternate embodiment of the cross-section 40. The cross-section 40 illustrated in FIG. 7 is similar to the cross-section 40 illustrated in FIG. 6, except in the cross-section 40 illustrated in FIG. 7, the first interconnect bump 14 is on the first passivation layer 12, the second passivation layer 34, and the first interconnect layer 54. Further, the first interconnect bump 14 protrudes through the first passivation layer 12 and through the second passivation layer 34. Also, the first interconnect bump 14 is thermally and electrically connected to the first semiconductor device 22 (FIG. 2) via the first interconnect layer 54.

Figure 8:
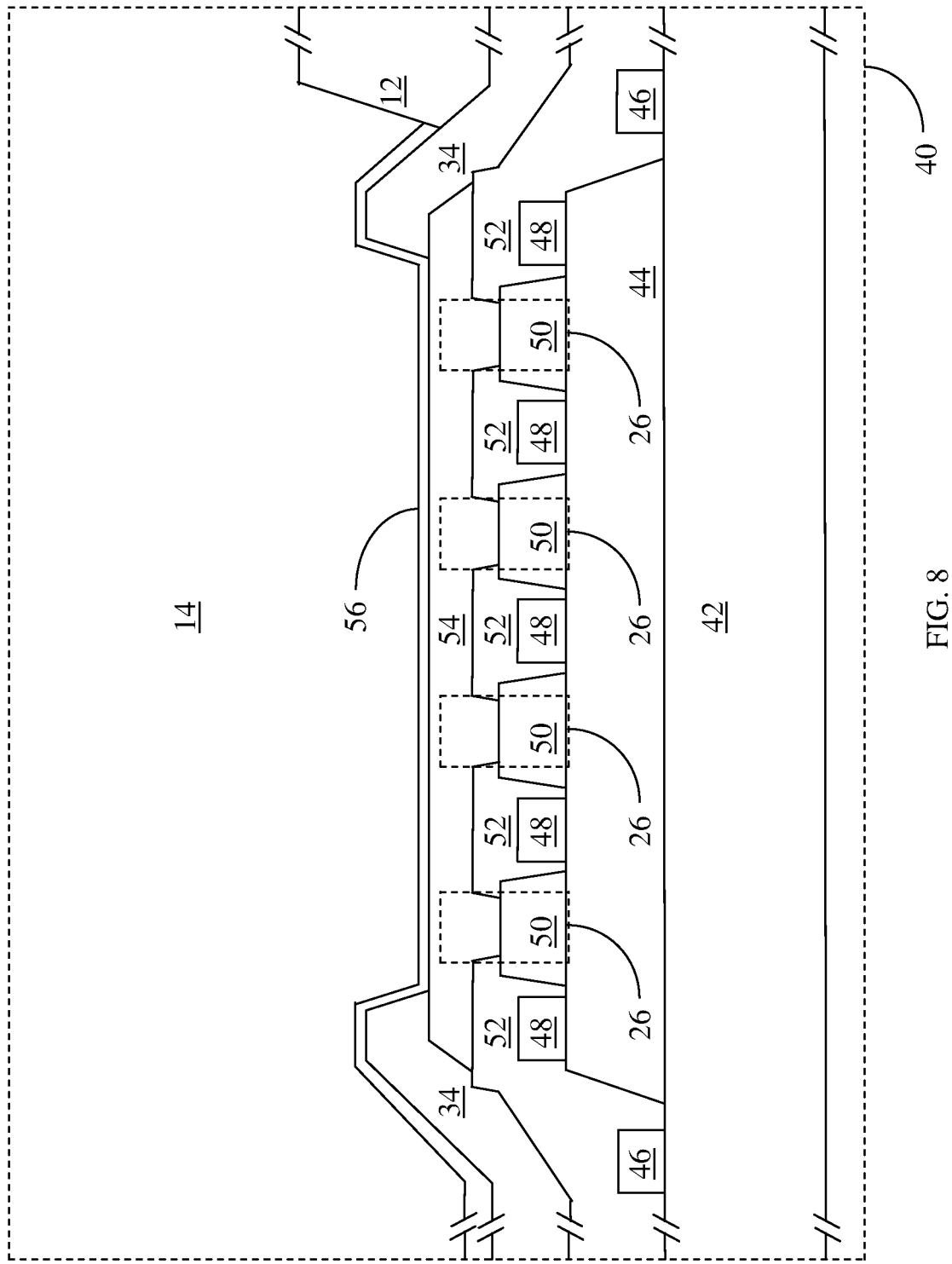
FIG. 8 shows the cross-section of the portion of the semiconductor die illustrated in FIG. 3 according to an additional embodiment of the cross-section.

FIG. 8 shows the cross-section 40 of the portion of the semiconductor die 10 illustrated in FIG. 3 according to an additional embodiment of the cross-section 40. The cross-section 40 illustrated in FIG. 8 is similar to the cross-section 40 illustrated in FIG. 7, except in the cross-section 40 illustrated in FIG. 8, the semiconductor die 10 (FIG. 3) further includes a first under bump metallization layer 56 on the first interconnect layer 54, such that the first interconnect bump 14 is on the first under bump metallization layer 56. In general, the first interconnect bump 14 is over the first interconnect layer 54. In one embodiment of the first under bump metallization layer 56, the first under bump metallization layer 56 includes Titanium. In one embodiment of the first under bump metallization layer 56, the first under bump metallization layer 56 includes any metal. In one embodiment of the first under bump metallization layer 56, a thickness of the first under bump metallization layer 56 is between about 500 Angstroms and about 1500 Angstroms. In one embodiment of the first under bump metallization layer 56, the first under bump metallization layer 56 is a seed layer for the first interconnect bump 14. In one embodiment of the first under bump metallization layer 56, the first under bump metallization layer 56 promotes adhesion to the first interconnect layer 54. In one embodiment of the first under bump metallization layer 56, the first under bump metallization layer 56 substantially prevents electro-migration of the first interconnect layer 54.

Figure 9:
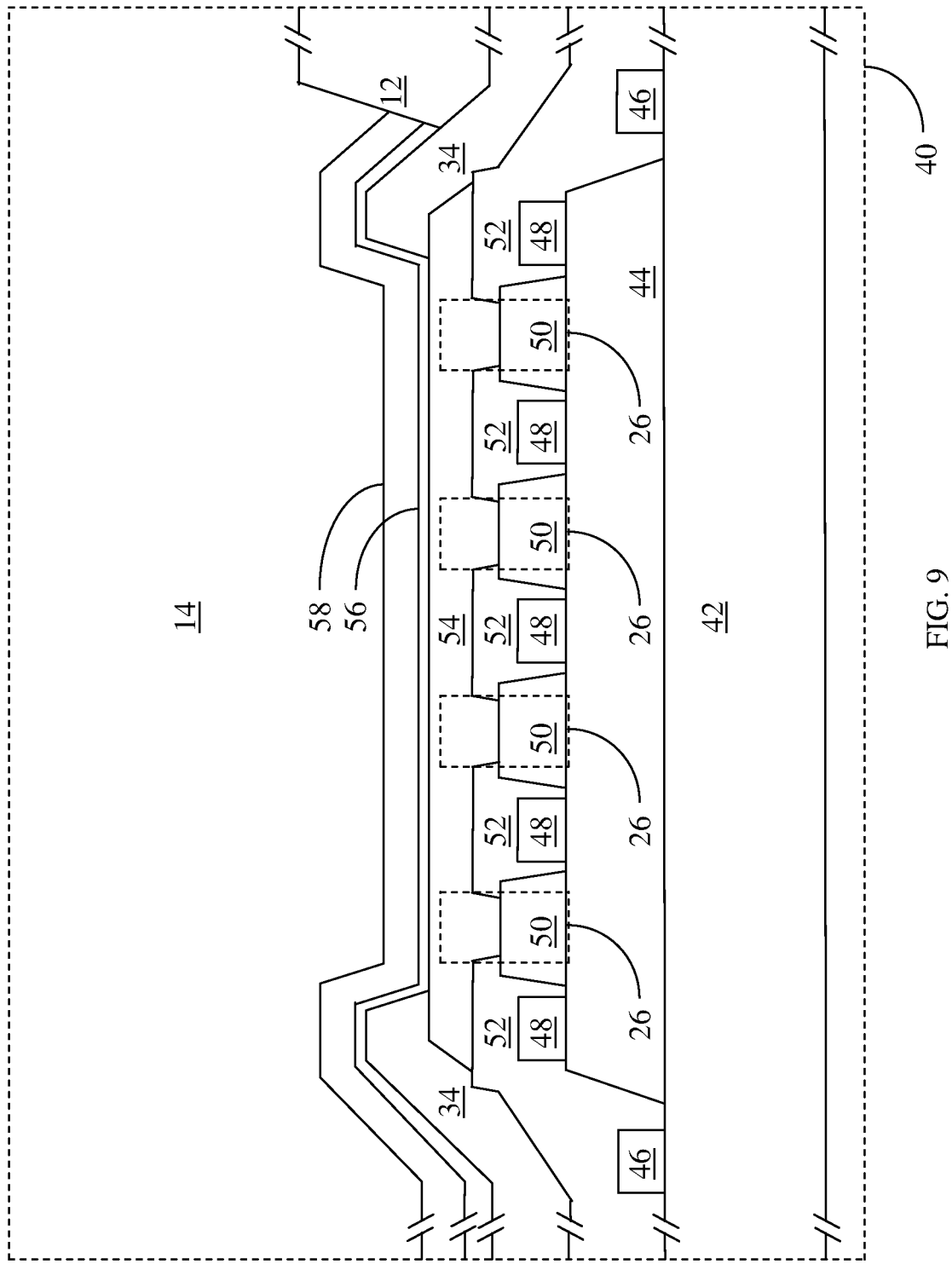
FIG. 9 shows the cross-section of the portion of the semiconductor die illustrated in FIG. 3 according to another embodiment of the cross-section.

FIG. 9 shows the cross-section 40 of the portion of the semiconductor die 10 illustrated in FIG. 3 according to another embodiment of the cross-section 40. The cross-section 40 illustrated in FIG. 9 is similar to the cross-section 40 illustrated in FIG. 8, except in the cross-section 40 illustrated in FIG. 9, the semiconductor die 10 (FIG. 3) further includes a second under bump metallization layer 58 on the first under bump metallization layer 56, such that the first interconnect bump 14 is on the second under bump metallization layer 58. In general, the semiconductor die 10 (FIG. 3) includes at least one under bump metallization layer 56, 58 on the first interconnect layer 54, such that the first interconnect bump 14 is on the at least one under bump metallization layer 56, 58.

In one embodiment of the second under bump metallization layer 58, the second under bump metallization layer 58 includes Copper. In one embodiment of the second under bump metallization layer 58, the second under bump metallization layer 58 includes Tungsten. In one embodiment of the second under bump metallization layer 58, the second under bump metallization layer 58 includes any metal. In one embodiment of the second under bump metallization layer 58, a thickness of the second under bump metallization layer 58 is between about 3000 Angstroms and about 5000 Angstroms. In one embodiment of the first under bump metallization layer 56 and the second under bump metallization layer 58, the first under bump metallization layer 56 and the second under bump metallization layer 58 are seed layers for the first interconnect bump 14. In one embodiment of the first under bump metallization layer 56, the first under bump metallization layer 56 promotes adhesion to the first interconnect layer 54. In one embodiment of the first under bump metallization layer 56, the first under bump metallization layer 56 substantially prevents electro-migration of the first interconnect layer 54.

Figure 10:
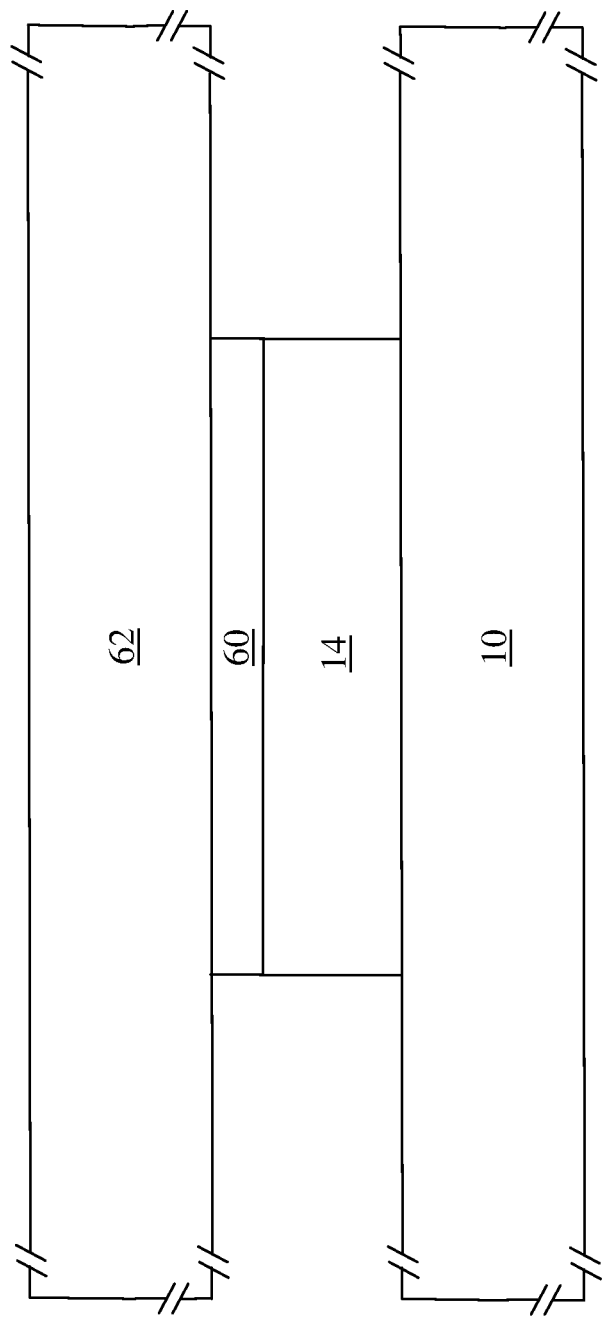
FIG. 10 shows the semiconductor die attached to an external device according to one embodiment of the semiconductor die.

FIG. 10 shows the semiconductor die 10 attached to an external device according to one embodiment of the semiconductor die 10. FIG. 10 illustrates a front-view of the semiconductor die 10 illustrated in FIG. 4. Solder 60 is on the first interconnect bump 14 and a laminate 62 is on the solder 60. As such, the first interconnect bump 14 is soldered to the laminate 62. Since the laminate 62 is an external device, the first interconnect bump 14 provides an electrical connection from the first semiconductor device 22 (FIG. 5) to an external device. Further, the first interconnect bump 14 provides an electrical connection from the second semiconductor device 24 (FIG. 5) to an external device. In one embodiment of the solder 60, a thickness of the solder 60 is equal to about 25 micrometers. In one embodiment of the solder 60, the solder 60 is a Tin/Silver alloy. Other embodiments of the solder 60 may include other metals or other metal alloys.

In one embodiment of the laminate 62, the laminate 62 functions as a heatsink. In one embodiment of the laminate 62, the laminate 62 is configured to conduct heat away from the first semiconductor device 22 (FIG. 5) via the first interconnect bump 14. In an alternate embodiment of the laminate 62, the laminate 62 is configured to conduct heat away from both the first semiconductor device 22 (FIG. 5) and the second semiconductor device 24 (FIG. 5) via the first interconnect bump 14. In one embodiment of the laminate 62, the laminate 62 provides a ground connection to the semiconductor die 10 via the first interconnect bump 14. In an alternate embodiment of the laminate 62, the laminate 62 provides a power supply connection to the semiconductor die 10 via the first interconnect bump 14.

Figure 11:
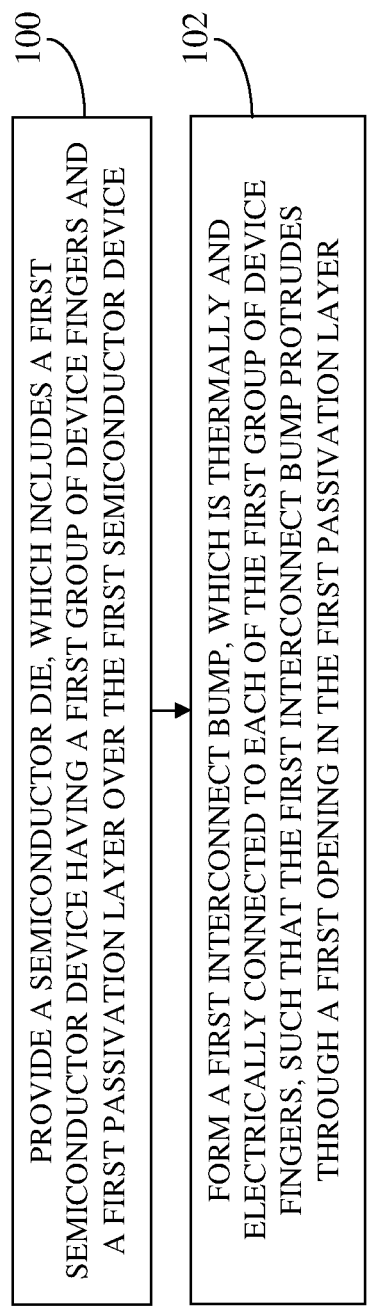
FIG. 11 illustrates a process for forming the semiconductor die illustrated in FIG. 6 according to one embodiment of the semiconductor die.

FIG. 11 illustrates a process for forming the semiconductor die 10 illustrated in FIG. 6 according to one embodiment of the semiconductor die 10. Provide a semiconductor die 10 (FIG. 2), which includes a first semiconductor device 22 (FIG. 2) having a first group 26 (FIG. 2) of device fingers and a first passivation layer 12 (FIG. 2) over the first semiconductor device 22 (FIG. 2) (Step 100). Form a first interconnect bump 14 (FIG. 1), which is thermally and electrically connected to each of the first group 26 (FIG. 2) of device fingers, such that the first interconnect bump 14 (FIG. 1) protrudes through a first opening 18 (FIG. 2) in the first passivation layer 12 (FIG. 2) (Step 102).

Figure 12:
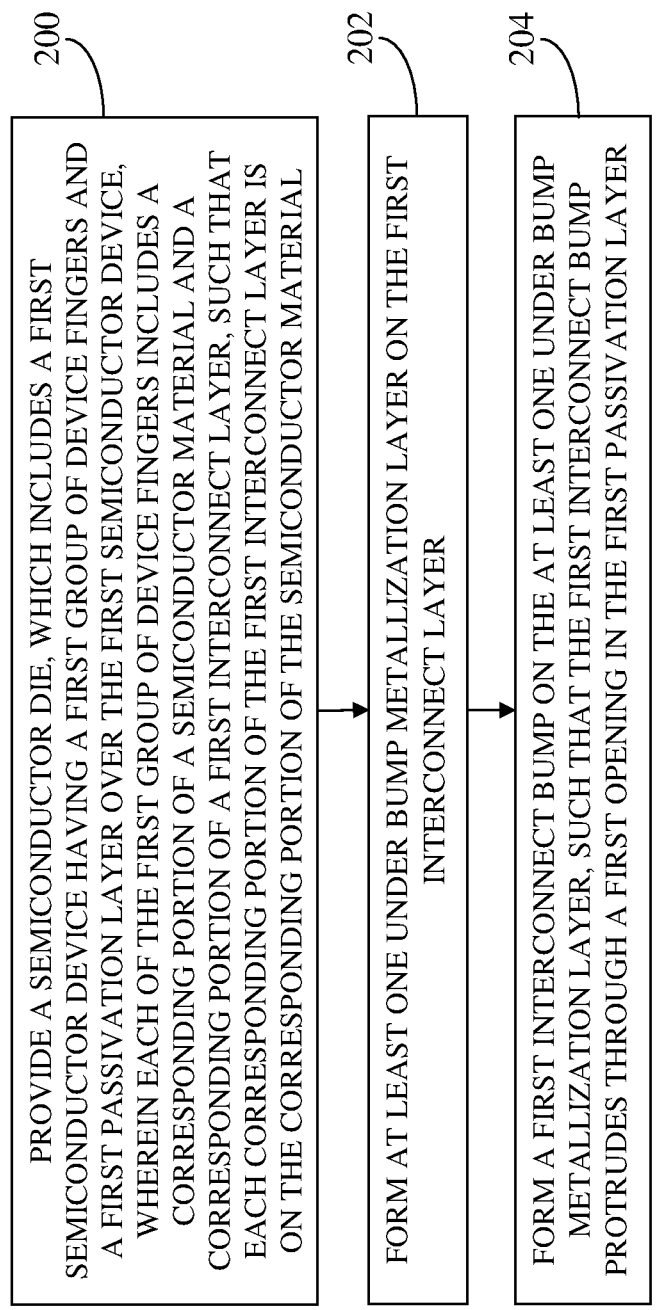
FIG. 12 illustrates a process for forming the semiconductor die illustrated in FIG. 9 according to an alternate embodiment of the semiconductor die.

FIG. 12 illustrates a process for forming the semiconductor die 10 illustrated in FIG. 9 according to an alternate embodiment of the semiconductor die 10. Provide a semiconductor die 10 (FIG. 2), which includes a first semiconductor device 22 (FIG. 2) having a first group 26 (FIG. 2) of device fingers and a first passivation layer 12 (FIG. 2) over the first semiconductor device 22 (FIG. 2), wherein each of the first group 26 (FIG. 2) of device fingers includes a corresponding portion of a semiconductor material 50 (FIG. 9) and a corresponding portion of a first interconnect layer 54 (FIG. 9), such that each corresponding portion of the first interconnect layer 54 (FIG. 9) is on the corresponding portion of the semiconductor material 50 (FIG. 9) (Step 200). Form at least one under bump metallization layer 56, 58 (FIG. 9) on the first interconnect layer 54 (FIG. 9) (Step 202). In one embodiment of the at least one under bump metallization layer 56, 58 (FIG. 9), at least one under bump metallization layer 56, 58 (FIG. 9) is formed by sputtering. Form a first interconnect bump 14 (FIG. 1) on the at least one under bump metallization layer 56, 58 (FIG. 9), such that the first interconnect bump 14 (FIG. 1) protrudes through a first opening 18 (FIG. 2) in the first passivation layer 12 (FIG. 2) (Step 204). In one embodiment of the first interconnect bump 14 (FIG. 1), the first interconnect bump 14 (FIG. 1) is formed by electroplating.

Those skilled in the art will recognize improvements and modifications to the embodiments of the present disclosure. All such improvements and modifications are considered within the scope of the concepts disclosed herein and the claims that follow.

What is claimed is:

1. A semiconductor die comprising:
   a transistor having a plurality of device fingers, each of the plurality of device fingers comprising a semiconductor material;
   a first passivation layer over the transistor;
   a second passivation layer over the transistor, wherein the first passivation layer is over the second passivation layer;
   an interconnect bump protruding through a first opening in the first passivation layer and protruding through each of a plurality of openings in the second passivation layer; and
   an interconnect layer deposited over each of the plurality of device fingers and thermally and electrically connecting the interconnect bump to each of the plurality of device fingers.

2. The semiconductor die of claim 1 wherein the transistor has a plurality of sub-cells, wherein each of the plurality of sub-cells has a corresponding portion of the plurality of device fingers.

3. The semiconductor die of claim 1 wherein the second passivation layer comprises Silicon Dioxide.

4. The semiconductor die of claim 1 wherein a thickness of the second passivation layer adjacent to each of the plurality of openings is between 150 nanometers and 5500 nanometers.

5. The semiconductor die of claim 1 wherein the first passivation layer comprises BenzoCycloButene.

6. The semiconductor die of claim 1 wherein the interconnect bump is configured to conduct heat away from the transistor and provide an electrical connection from the transistor to an external device.

7. The semiconductor die of claim 1 wherein the interconnect bump is a flip chip bump.

8. The semiconductor die of claim 1 wherein the interconnect bump comprises Copper.

9. The semiconductor die of claim 8 wherein the interconnect layer comprises Gold.

10. The semiconductor die of claim 9 wherein the semiconductor material comprises Gallium Arsenide.

11. The semiconductor die of claim 9 wherein the semiconductor material comprises N-type Gallium Arsenide.

12. The semiconductor die of claim 8 further comprising a first under bump metallization layer on the interconnect layer, wherein the interconnect bump is over the first under bump metallization layer.

13. The semiconductor die of claim 12 wherein the first under bump metallization layer comprises Titanium.

14. The semiconductor die of claim 12 wherein a thickness of the first under bump metallization layer is between 500 Angstroms and 1500 Angstroms.

15. The semiconductor die of claim 12 wherein the interconnect bump is on the first under bump metallization layer.

16. The semiconductor die of claim 12 further comprising a second under bump metallization layer, wherein the first under bump metallization layer is on the interconnect layer, the second under bump metallization layer is on the first under bump metallization layer, and the interconnect bump is on the second under bump metallization layer.

17. The semiconductor die of claim 1 wherein the transistor is a heterojunction bipolar transistor.

18. The semiconductor die of claim 1 wherein the transistor is a bipolar junction transistor.

19. The semiconductor die of claim 1 wherein an emitter of the transistor comprises the plurality of device fingers.

\* \* \* \* \*